US008085609B2

(12) United States Patent
Shinoda

(10) Patent No.: US 8,085,609 B2

(45) Date of Patent: Dec. 27, 2011

(54) NONVOLATILE SEMICONDUCTOR MEMORY AND METHOD FOR DETECTING LEAKAGE DEFECTS OF THE SAME

(75) Inventor: Tatsuru Shinoda, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 114 days.

(21) Appl. No.: 12/648,351

(22) Filed: Dec. 29, 2009

(65) Prior Publication Data

US 2010/0188896 A1 Jul. 29, 2010

(30) Foreign Application Priority Data

Jan. 29, 2009 (JP) ................................ 2009-018430

(51) Int. Cl.
*G11C 29/00* (2006.01)
*G11C 16/06* (2006.01)

(52) U.S. Cl. .................................. 365/201; 365/185.23

(58) Field of Classification Search .................. 365/201, 365/185.23, 230.06, 185.24
See application file for complete search history.

(56) References Cited

U.S. PATENT DOCUMENTS 5,790,459 A * 8/1998 Roohparvar ............ 365/185.21
6,016,274 A * 1/2000 Itoh ......................... 365/185.29
6,480,432 B1 * 11/2002 Nakayama .................... 365/201
7,184,305 B2 * 2/2007 Tanno ..................... 365/185.09

FOREIGN PATENT DOCUMENTS

JP 2000-276882 10/2000

* cited by examiner

*Primary Examiner* — Anh Phung

(74) *Attorney, Agent, or Firm* — Taft Stettinius & Hollister LLP

(57) ABSTRACT

There is provided a nonvolatile semiconductor memory wherein a normal mode voltage is provided to a selected word line when a normal mode is selected, and a test mode voltage lower than the normal mode voltage is provided to the selected word line when a test mode is selected, thus leakage current is detected by selecting the test mode.

8 Claims, 5 Drawing Sheets

100
WORD LINE VOLTAGE GENERATOR 4
VW
MODE SELECTOR 3
ROW DECODER 5
SM DM
B1 B2 B3 Bm
M11 M12 M13 M1m W1
M21 M22 M23 M2m W2
Mn1 Mn2 Mn3 Mnm Wn
1
DRAIN VOLTAGE GENERATOR 2
AD
COLUMN DECODER 7
8
S1 S2 S3 Sm 6
Ids
SENSE AMPLIFIER 10
Iref
REFERENCE CURRENT GENERATOR 9
OUTPUT BUFFER 11
DT

PRIOR ART

NONVOLATILE SEMICONDUCTOR MEMORY AND METHOD FOR DETECTING LEAKAGE DEFECTS OF THE SAME

CROSS-REFERENCE TO RELATED APPLICATIONS

This application is based on and claims priority under 35 U.S.C. §119 from Japanese Patent Application No. 2009-018430, filed on Jan. 29, 2009, the disclosure of which is incorporated by reference herein.

RELATED ART

1. Field of the Disclosure

The present disclosure relates to a nonvolatile semiconductor memory including a plurality of memory cells and a method for detecting leakage defects of the same.

2. Description of the Related Art

A nonvolatile semiconductor memory such as a flash memory including a plurality of memory cells arranged in a matrix of rows and columns as is described, for example, in Japanese Patent Application Publication Kokai No. 2000-276882 (hereinafter, referred to as "Patent Reference 1"), is well known. In this memory, it is possible to select one of the plurality of memory cells by selecting one word line and one bit line from word lines and hit lines that cross each other. A sense amplifier that is connected to the bit lines compares a cell current flowing from the selected memory cell to a corresponding bit line with a predetermined reference current to determine whether a data value of the memory cell is "1" or "0".

FIG. 1A illustrates I-V characteristics of a selected memory cell. The horizontal axis represents a gate voltage Vg of the selected memory cell and the vertical axis represents a cell current Ids of the selected memory cell. Specifically, FIG. 1A shows I-V characteristics IV1 of the selected memory cell when the data value of the memory cell is "1", I-V characteristics IV0 when the data value is "0", a gate voltage Vg1, and a reference current Iref1. For a memory cell whose data value is "1", the sense amplifier outputs a data value of "1" since the threshold of the memory cell whose data value is "1" is relatively low and a cell current Ids1 flowing in the bit line when the memory cell is selected is greater than the reference current Iref1. On the other hand, for a memory cell whose data value is "0", the sense amplifier outputs a data value of "0" since the threshold of the memory cell whose data value is "0" is relatively high and a cell current Ids0 flowing in the bit line when the memory cell is selected is smaller than the reference current Iref1.

Since the sense amplifier determines the data value stored in the memory cell using the cell current as described above, erroneous determination may occur when the memory cell is defective. Conventionally, a condition (referred to as a "leakage defect"), in which an abnormal current flows in a bit line, for example, due to short-circuiting, is detected in the following manner. FIG. 1B illustrates I-V characteristics of a selected memory cell when the memory cell is normal and when a leakage defect is present. Specifically, FIG. 1B shows I-V characteristics IV1 of a normal memory cell and I-V characteristics IVL1 of a defective memory cell when the data value of the memory cell is "1", I-V characteristics IV0 of a normal memory cell and I-V characteristics IVL0 of a defective memory cell when the data value is "0", a gate voltage Vg2, and a reference current Iref0.

In order to determine whether each memory cell is normal or defective, there is a need to set the reference current to a level between the cell current of the normal memory cell and the cell current of the defective memory cell. In addition, it is desirable that the reference current be set small in order to detect a small leakage current. To meet these requirements, the reference current is set to, for example, a reference current Iref0 as shown in FIG. 1B.

In addition, the gate voltage needs to be set low, taking into consideration that the I-V characteristics of the memory cell vary and the cell current of each memory cell differs even with the same data value and the same gate voltage. However, the gate voltage that is provided to the word line cannot be lower than a specific level for activating the memory cell. The lower limit of the gate voltage is, for example, the gate voltage Vg2 as shown in FIG. 1B. The gate voltage Vg2 is, for example, about 1V.

When the reference current Iref0 is between the cell current of the normal memory cell and the cell current of the defective memory cell, it is possible to determine whether the memory cell is normal or abnormal. However, at the gate voltage Vg2, it is not possible to determine whether each memory cell with a data value of "1" is normal or abnormal since both the cell current Ids1 of the normal memory cell and the cell current IdsL1 of the defective memory cell are larger than the reference current Iref0 when the data value of the memory cell is "1". On the other hand, it is possible to determine whether each memory cell with a data value of "0" is normal or abnormal since the cell current Ids0 of the normal memory cell is smaller than the reference current Iref0 and the cell current IdsL0 of the defective memory cell is larger than the reference current Iref0 when the data value of the memory cell is "0". In this case, the cell current Ids0 of the normal memory cell is 0 A and the cell current IdsL0 of the defective memory cell has the same level as a leakage current LK.

It is necessary to write a data value of "0" to all memory cells in order to determine whether each memory cell is normal or abnormal when there is a constraint on the lower limit of the gate voltage Vg as described above. This complicates the procedure for detecting defective memory cells.

INTRODUCTION TO THE INVENTION

Therefore, the present disclosure has been made in view of the above problems, and it is an object of the present disclosure to provide a nonvolatile semiconductor memory, which has a configuration enabling detection of leakage defects of memory cells, regardless of data values of the memory cells, and a method for detecting leakage defects of the nonvolatile semiconductor memory.

The present disclosure provides a nonvolatile semiconductor memory including a plurality of memory cells arranged in a matrix of rows and columns, a plurality of word lines, each being commonly connected to respective gates of memory cells arranged in one of the rows, a plurality of bit lines commonly connected to respective sources of memory cells arranged in one of the columns, a drain voltage generator that provides a drain voltage to respective drains of the plurality of memory cell, a row decoder that selects one of the plurality of word lines, a column decoder that selects one of the plurality of bit lines, a sense amplifier that outputs data based on comparison of a cell current from a memory cell corresponding to the selections by the row and column decoders with a reference current, and a mode selector that outputs either a normal mode signal or a test mode signal according to a mode selection instruction, wherein the row decoder provides a normal mode voltage to the selected word line according to the normal mode signal and provides a test mode voltage lower than the normal mode voltage to the selected word line according to the test mode signal.

The present disclosure also provides a method for detecting leakage defects in a nonvolatile semiconductor memory including a plurality of memory cells arranged in a matrix of rows and columns, a plurality of word lines, each being commonly connected to respective gates of memory cells arranged in one of the rows, a plurality of bit lines commonly connected to respective sources of memory cells arranged in one of the columns, a drain voltage generator that provides a drain voltage to respective drains of the plurality of memory cell, a row decoder that selects one of the plurality of word lines, a column decoder that selects one of the plurality of bit lines, and a sense amplifier that outputs data based on comparison of a cell current from a memory cell corresponding to the selections by the row and column decoders with a reference current, the method including a mode selection process for outputting either a normal mode signal or a test mode signal according to a mode selection instruction and a word line voltage providing process for providing a normal mode voltage to the selected word line according to the normal mode signal and providing a test mode voltage lower than the normal mode voltage to the selected word line according to the test mode signal.

The nonvolatile semiconductor memory according to the present disclosure enables detection of defective memory cells, regardless of data values of memory cells. The method for detecting leakage defects according to the present disclosure also enables detection of defective memory cells, regardless of data values of memory cells.

BRIEF DESCRIPTION OF THE DRAWINGS

Exemplary embodiments of the present disclosure will be described in detail based on the following figures, wherein.

DETAILED DESCRIPTION

The exemplary embodiments of the present disclosure are described and illustrated below to encompass a nonvolatile semiconductor memory including a plurality of memory cells and a method for detecting leakage defects of the same. Of course, it will be apparent to those of ordinary skill in the art that the preferred embodiments discussed below are exemplary in nature and may be reconfigured without departing from the scope and spirit of the present disclosure. However, for clarity and precision, the exemplary embodiments as discussed below may include optional steps, methods, and features that one of ordinary skill should recognize as not being a requisite to fall within the scope of the present disclosure. Hereinafter, an exemplary embodiment of the present disclosure will be described in detail with reference to the drawings.

Figure 1A:
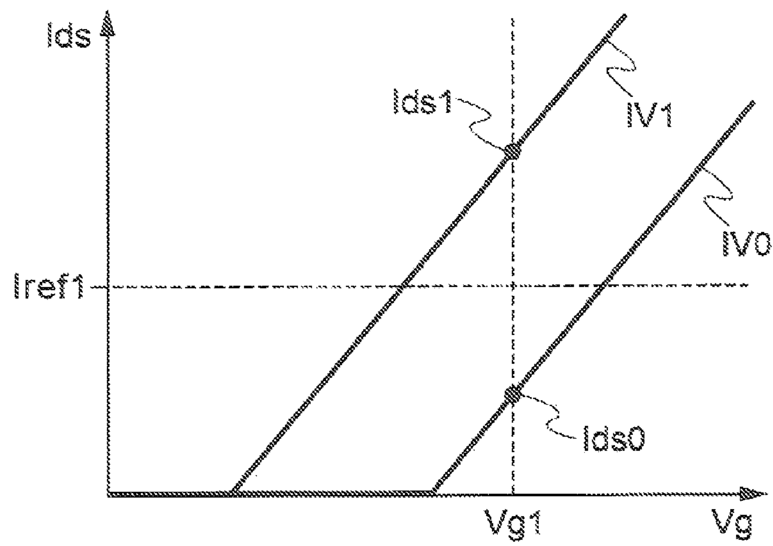
FIG. 1A illustrates I-V characteristics of a selected memory cell according to a conventional technology and FIG. 1B illustrates I-V characteristics of a selected memory cell when the memory cell is normal and when a leakage defect is present.
Figure 1B:
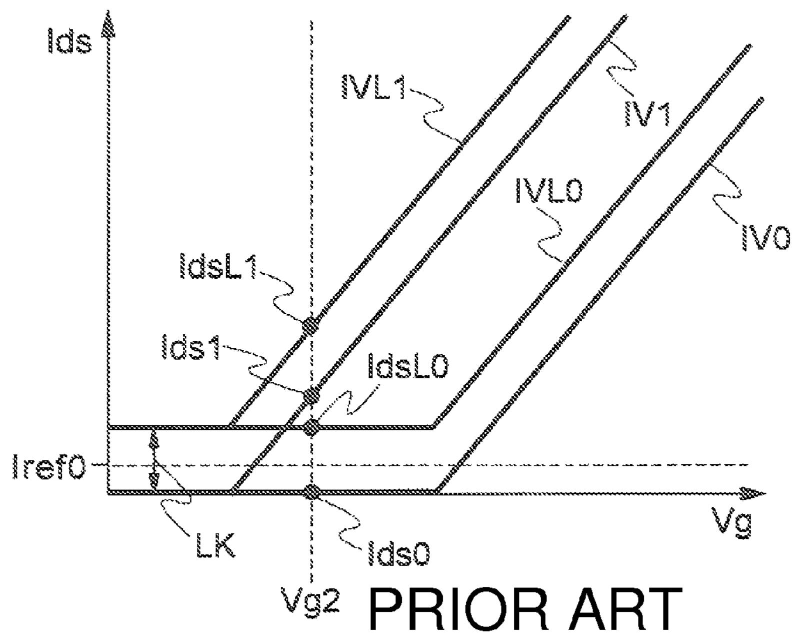
Figure 2:
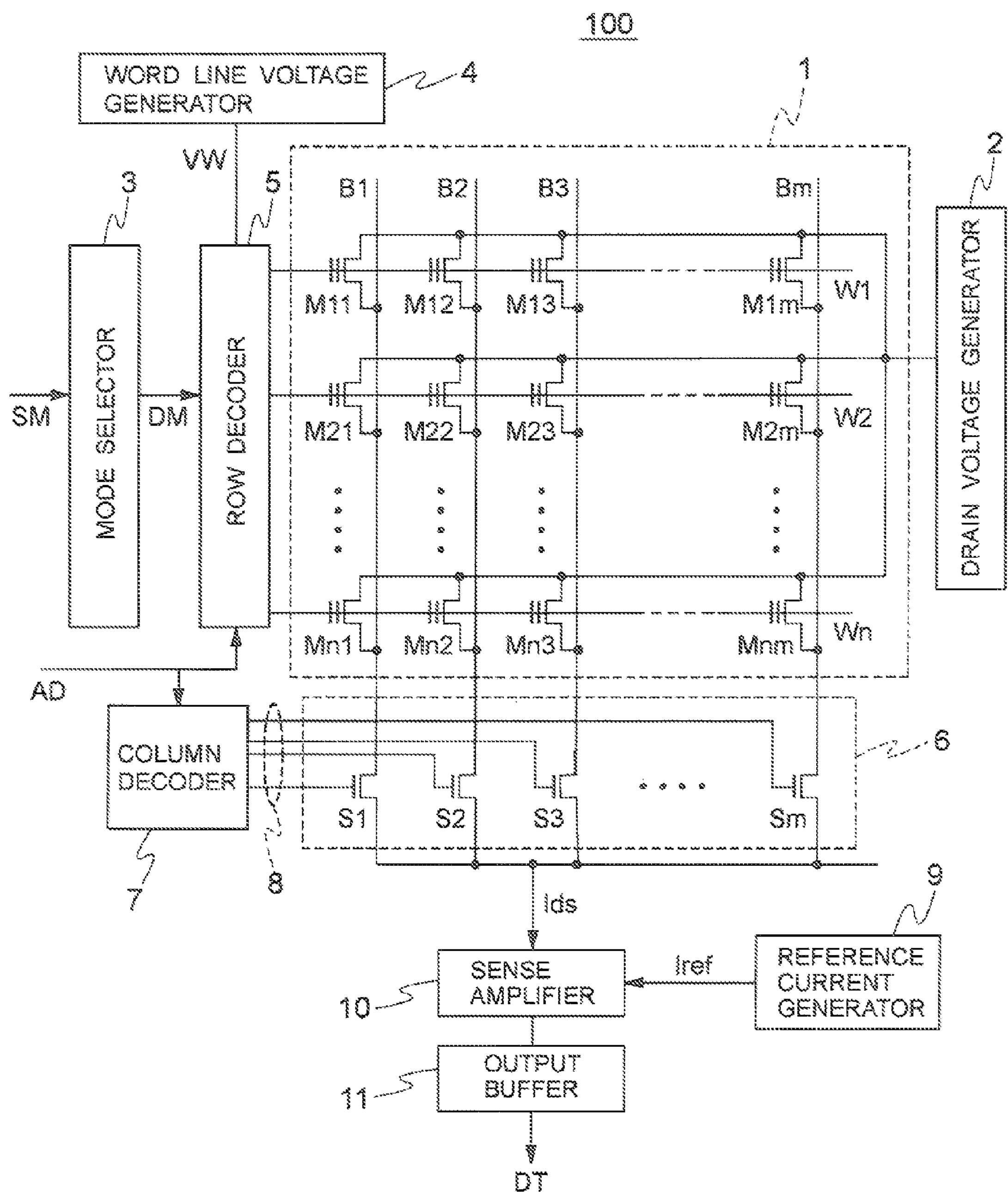
FIG. 2 is a block diagram illustrating a nonvolatile semiconductor memory according to an embodiment of the present disclosure.

FIG. 2 is a block diagram illustrating a nonvolatile semiconductor memory 100 according to an embodiment of the present disclosure. A memory cell array 1 includes memory cells M11 to Mnm arranged in a matrix, where "n" and "m" are each an integer greater than 1. Each of the memory cells M11 to Mnm is, for example, a Metal Oxide Semiconductor (MOS) having a control gate and a floating gate.

A word line W1 is connected to respective control gates of the memory cells M11 to M1*m*, a word line W2 is connected to respective control gates of the memory cells M21 to M2*m*, . . . , and a word line Wn is connected to respective control gates of the memory cells Mn1 to Mnm.

A bit line B1 is connected to respective sources of the memory cells M11 to Mn1, a bit line B2 is connected to respective sources of the memory cells M12 to Mn2, . . . , and a bit line Bm is connected to respective sources of the memory cells M1*m* to Mnm.

Respective drains of the memory cells M11 to Mnm are connected to a drain voltage generator 2.

The drain voltage generator 2 generates and provides a drain voltage to respective drains of the memory cells M11 to Mnm.

A mode selector 3 selects one of a plurality of preset operating modes according to a mode selection signal SM which is a mode selection instruction and outputs an operating mode signal DM indicating the selected operating mode. Specifically, the mode selector 3 outputs an operating mode signal DM indicating a normal mode when the mode selection signal SM indicates the normal mode and outputs an operating mode signal DM indicating a test mode when the mode selection signal SM indicates the test mode. For example, the mode selection signal SM is input as an electrical signal to an electrode pad provided on a board (not shown) on which the nonvolatile semiconductor memory 100 is mounted and is then provided to the mode selector 3 through a metal wiring pattern formed in a wiring layer on the board.

The word line voltage generator 4 generates a word line voltage VW to be provided to the word lines W1 to Wn and provides the word line voltage VW to a row decoder 5.

The row decoder 5 selects one of the word lines W1 to Wn based on an address signal AD provided from the outside. For example, the address signal AD is input as an electrical signal to an electrode pad provided on the hoard (not shown) on which the nonvolatile semiconductor memory 100 is mounted and is then provided to the row decoder 5 through a metal wiring pattern formed in a wiring layer on the board.

The row decoder 5 provides the word line voltage VW generated by the word line voltage generator 4 as a normal mode voltage to the selected word line according to the mode signal DM indicating the normal mode from the mode selector 3. On the other hand, the row decoder 5 provides a voltage lower than the word line voltage VW as a test mode voltage to the selected word line according to the mode signal DM indicating the test mode from the mode selector 3. Here, the row decoder 5 obtains the test mode voltage by shifting the level of the word line voltage VW from the word line voltage generator 4.

In order to enable detection of leakage defects regardless of whether a data value stored in each of the memory cells M11 to Mnm is "0" or "1", it is preferable that the test mode voltage be set lower than a threshold of the memory cell when the data value of the memory cell is "1". In addition, taking into consideration that the I-V characteristics of the memory cells M11 to Mnm vary, it is preferable that the gate voltage be set as low as possible. That is, the test mode voltage is preferably set to nearly 0V, more preferably set to 0V, i.e., the ground voltage. Generally, the ground voltage is equal to the potential (GND) of the board on which the nonvolatile semiconductor memory 100 is mounted.

A column switch 6 is a switch for selecting one of the bit lines B1 to Bm. The column switch 6 includes switches S1 to Sm. The switch S1 selects the bit line B1, the switch S2 selects the bit line B2, . . . , and the switch Sm selects the bit line Bm. Each of the switches is, for example, a transistor.

A column decoder 7 selects one of the switches S1 to Sm through a switch selection line 8 based on the address signal AD from the outside. When the switches S1 to Sm are transistors, the column decoder 7 selects one of the switches S1 to Sm by providing a selection voltage of for example, 1V to a gate of a corresponding one of the transistors through the switch selection line 8. A cell current Ids is provided to a sense amplifier 10 from the bit line selected by the column decoder 7.

One of the memory cells M11 to Mnm can be selected through selection of one of the word lines W1 to Wn by the row decoder 5 and selection of one of the bit lines B1 to Bm by the column decoder 7. For example, the memory cell M11 is selected when the word line W1 is selected by the row decoder 5 and the bit line B1 is selected by the column decoder 7.

A data value of "0" is written to the memory cell M11 by applying a voltage to the control gate of the memory cell M11 which is a MOS transistor through the word line W1 so that electrons are injected into the floating gate thereof. On the other hand, a data value of "1" is written to the memory cell M11 by causing the drain voltage generator 2 to apply a voltage between the drain and the source of the memory cell M11 so that electrons are drawn from the floating gate thereof. The written data value is stored in a form of presence or absence of electrons in the floating gate of the memory cell M11. The same writing processes are applied to each of the memory cells M12 to Mnm.

Each of the memory cells M11 to Mnm has an initial data value of "1". Each memory cell whose initial data value is "1" has a low threshold and provides a cell current Ids to a corresponding hit line (i.e., a corresponding one of the bit lines B1 to Bm) when the memory cell is selected. On the other hand, each memory cell whose data value is "0" since writing has been done has a high threshold and provides a cell current Ids, which is smaller than the cell current Ids provided to the memory cell when the data value of the memory cell is "1", to a corresponding bit line (i.e., one of the bit lines B1 to Bm) when the memory cell is selected.

A reference current generator 9 is a circuit that generates and provides a reference current Iref to the sense amplifier 10. The value of the reference current Iref may be preset. The value of the reference current Iref is set to, for example, about a half of an expected leakage current value so that it is possible to determine presence or absence of a leakage current from the memory cells M11 to Mnm.

The sense amplifier 10 compares the cell current Ids from the column switch 6 with the reference current Iref from the reference current generator 9 and provides a signal indicating a logic value of "1" to an output buffer 11 if the cell current Ids is greater than the reference current Iref, and provides a signal indicating a logic value of "0" to the output buffer 11 if the cell current Ids is smaller than the reference current Iref.

The output buffer 11 outputs a data signal DT of "1" according to the signal indicating the logic value "1" from the sense amplifier 10 and outputs a data signal DT of "0" according to the signal indicating the logic value "0" from the sense amplifier 10.

Figure 3:
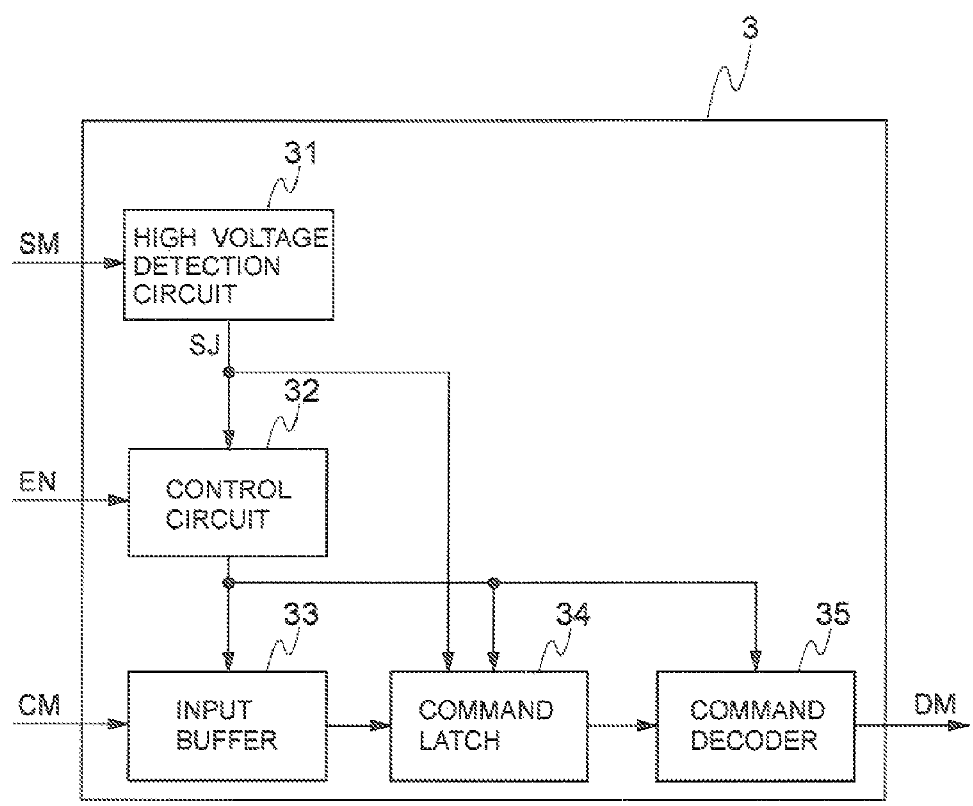
FIG. 3 is a circuit diagram of a mode selector.

FIG. 3 is a block diagram illustrating an example of the mode selector 3. The mode selector 3 includes a high voltage detection circuit 31, a control circuit 32, an input buffer 33, a command latch 34, and a command decoder 35.

The high voltage detection circuit 31 determines a mode indicated by the mode selection signal SM based on the voltage level of the mode selection signal SM and notifies the determined mode as a determination signal SJ to the control circuit 32. For example, the high voltage detection circuit 31 determines that the mode selection signal SM indicates the normal mode when the voltage level is less than 3V and determines that the mode selection signal SM indicates the test mode when the voltage level is equal to or greater than 3V. That is, to perform leakage defect detection, a mode selection signal SM of 3V or greater is provided to the mode selector 3.

The control circuit 32 controls the input buffer 33, the command latch 34, and the command decoder 35 according to the mode indicated by the determination signal SJ from the high voltage detection circuit 31. According to the determination signal SJ indicating the normal mode, the control circuit 32 causes the command decoder 35 to provide a mode signal DM indicating the normal mode to the row decoder 5. On the other hand, according to the determination signal SJ indicating the test mode, the control circuit 32 causes the command decoder 35 to provide a mode signal DM indicating the test mode to the row decoder 5.

It is also possible to select either the normal or test mode by providing an enable control signal EN to the control circuit 32 from the outside. In this case, a command CM indicating selection of the test mode is input to the input buffer 33 from the outside. Inputting of the command CM is implemented, for example, by inputting an electrical signal representing a binary value of, for example, "01011001" indicating selection of the test mode.

The command latch 34 holds the command CM from the input buffer 33. That is, the command latch 34 holds the command CM indicating test mode selection while the determination signal SJ from the high voltage detection circuit 31 indicates the test mode. The command decoder 35 decodes the command CM held in the command latch 34 and provides a mode signal DM indicating the test mode to the row decoder 5.

For example, each of the mode selection signal SM, the enable control signal EN, and the command CM is input as an electrical signal to an electrode pad provided on the board (not shown) on which the nonvolatile semiconductor memory 100 is mounted and is then provided to the mode selector 3 through a metal wiring pattern formed in a wiring layer on the board. Specifically, when an inspector conducts leakage current inspection, the inspector provides such signals to the mode selector 3, for example, using a signal generating device (not shown) such as a pulse generator.

Figure 4:
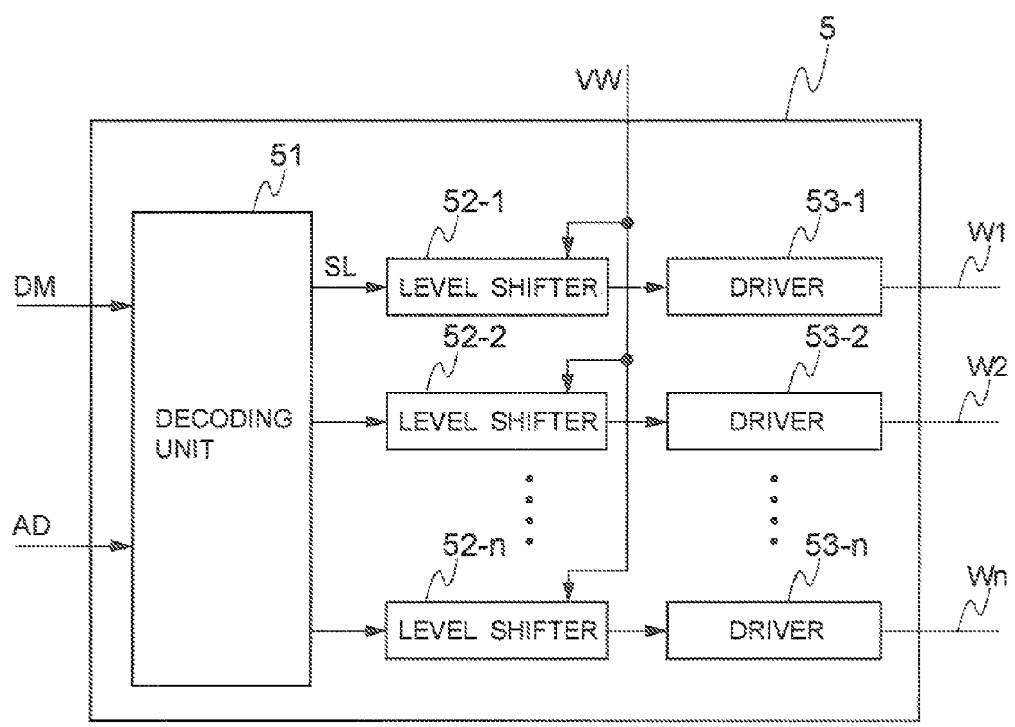
FIG. 4 is a circuit diagram of a row decoder.

FIG. 4 is a block diagram illustrating an example of the row decoder 5. The row decoder 5 includes a decoding unit 51, level shifters 52-1 to 52-*n*, and drivers 53-1 to 53-*n*. The level shifter 52-1 and the driver 53-1 correspond to the word line W1, the level shifter 52-2 and the driver 53-2 correspond to the word line W2, . . . , and the level shifter 52-*n* and the driver 53-*n* correspond to the word line Wn.

The decoding unit 51 selects a level shifter (i.e., one of the level shifters 52-1 to 52-*n*) corresponding to a word line (i.e., one of the word lines W1 to Wn) indicated by the address signal AD from the outside according to the mode signal DM from the mode selector 3. In the following description, the level shifter selected by the decoding unit 51 is referred to as a "selected level shifter". For example, the address signal AD may be a signal from a control circuit such as a microprocessor (not shown) and may also be a signal that is input as an electrical signal to an electrode pad provided on the board (not shown) on which the nonvolatile semiconductor memory 100 is mounted.

When it is determined that the mode signal DM indicates the test mode, the decoding unit 51 provides the selected level shifter with a selection signal SL including an instruction to shift the level of the word line voltage VW from the word line voltage generator 4 to generate a test mode voltage. On the other hand, when it is determined that the mode signal DM indicates the normal mode, the decoding unit 51 provides the selected level shifter with a selection signal SL including an instruction not to shift the level of the word line voltage VW.

The level shifter 52-1 shifts the level of the word line voltage VW to generate the test mode voltage according to the instruction to generate the test mode voltage included in the selection signal SL from the decoding unit 51. On the other hand, the level shifter 52-1 does not shift the word line voltage VW according to the instruction not to shift the level of the word line voltage VW included in the selection signal SL from the decoding unit 51. When no selection signal SL is provided to the level shifter 52-1, the level shifter 52-1 shifts the level of the word line voltage VW to generate a voltage of 0V. The level shifters 52-2 to **52-*n* operate in the same manner as the level shifter 52-1**.

The driver 53-1 provides the voltage of 0V or the test mode voltage, the level of which has been shifted by the level shifter 52-1, or the word line voltage, the level of which has not been shifted, to the word line W1. The drivers 53-2 to **53-*n* operate in the same manner as the driver 53-1**.

Figure 5:
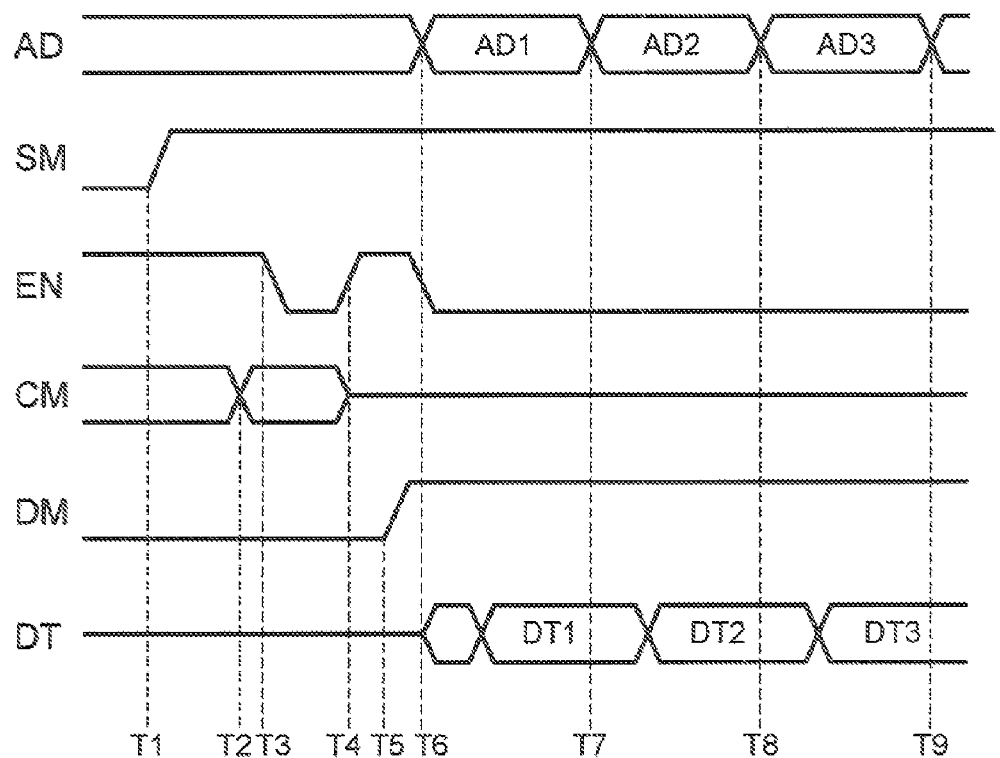
FIG. 5 is an operation timing chart of detection of leakage defects in a nonvolatile semiconductor memory.

FIG. 5 is a timing chart of a test mode operation for leakage defect detection in the nonvolatile semiconductor memory 100. The test mode operation is mainly divided into a test mode entry procedure (T1 to T5) and an actual test mode procedure (after T5).

First, a mode selection signal SM having a high voltage level (for example, 3V or greater) indicating selection of the test mode is provided to the mode selector 3 (time T1). Then, a command CM for selecting the test mode is input to the mode selector 3 (time T2) and an enable control signal EN drops to a low level (time T3) and then the command CM is latched in the mode selector 3. After the command CM is latched, the enable control signal EN is changed to a high level (time T4) and an operating mode signal DM (i.e., a high level signal) indicating the test mode is output from the mode selector 3 (time T5) and is then provided to the row decoder 5. The test mode entry procedure is then terminated.

In the subsequent test mode procedure, the inspector who conducts leakage defect detection provides an address signal AD indicating an address corresponding to one of the memory cells M11 to Mnm to the row decoder 5. The inspector sequentially switches the address indicated by the address signal AD to inspect all memory cells M11 to Mnm (time T6, T7, T8, . . . ).

The row decoder 5 provides a test mode voltage obtained by shifting the level of the word line voltage VW received from the word line voltage generator 4 to a word line (i.e., one of the word lines W1 to Wn) corresponding to the address indicated by the address signal AD. In order to enable detection of leakage defects regardless of whether a data value stored in each of the memory cells M11 to Mnm is "0" or "1", it is preferable that the test mode voltage be set lower than a threshold of the memory cell when the data value of the memory cell is "1". In addition, taking into consideration that the I-V characteristics of the memory cells M11 to Mnm vary, it is preferable that the gate voltage be set as low as possible. That is, the test mode voltage is preferably set to nearly 0V.

The address signal AD is also provided to the column decoder 7 and the column decoder 7 selects a bit line (i.e., one of the bit lines B1 to Bm) corresponding to an address indicated by the address signal AD.

A cell current Ids of a memory cell (i.e., one of the memory cells M11 to Mnm) selected by the row decoder 5 and the column decoder 7 is provided to the sense amplifier 10 through the selected bit line. The sense amplifier 10 compares the cell current Ids with the reference current Iref from the reference current generator 9. The sense amplifier 10 outputs a data signal DT of "1" (high level) when the cell current Ids is greater than the reference current Iref and outputs a data signal DT of "0" (low level) when the cell current Ids is less than the reference current Iref (DT1, DT2, DT3, . . . ).

Figure 6:
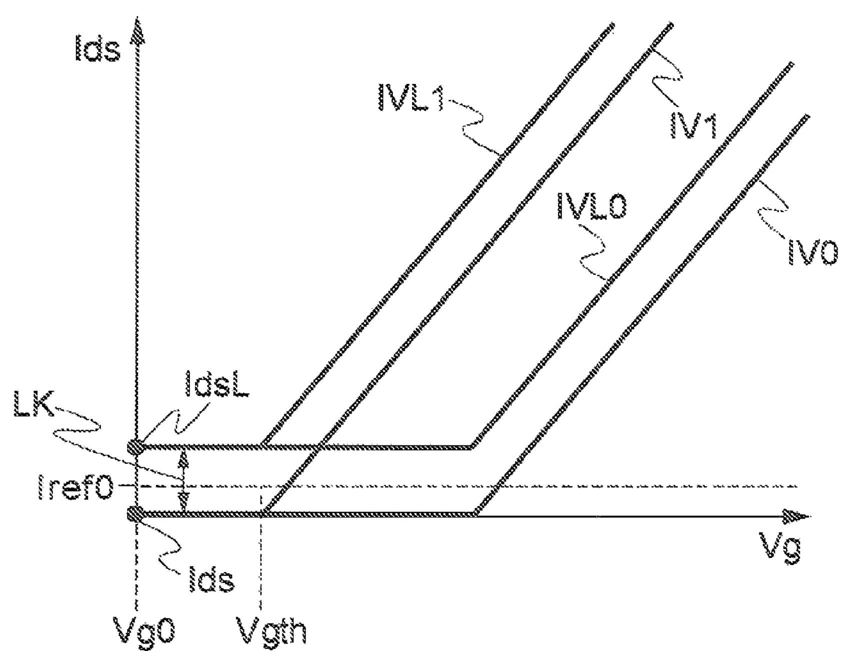
FIG. 6 illustrates I-V characteristics of a selected memory cell according to the embodiment.

FIG. 6 illustrates I-V characteristics of a selected memory cell when the memory cell is normal and when a leakage defect is present. The horizontal axis represents a gate voltage Vg of the selected memory cell and the vertical axis represents a cell current Ids of the selected memory cell. Specifically, FIG. 6 shows I-V characteristics IV1 of a normal memory cell and I-V characteristics IVL1 of a defective memory cell when the data value of the memory cell is "1", I-V characteristics IV0 of a normal memory cell and I-V characteristics IVL0 of a defective memory cell when the data value is "0", a reference current Iref0, a gate voltage Vg0, and a memory cell threshold voltage Vgth.

There is no limitation on the set value of the reference current Iref0. For example, the reference current Iref0 is set to a current value that is half of an expected leakage current according to the performance of the memory cells M11 to Mnm. The gate voltage Vg0 is a voltage that is provided to the gate of the selected memory cell through a word line. Here, the gate voltage Vg0 is 0V. The memory cell threshold voltage Vgth is a threshold voltage of the selected memory cell when the data value stored in the selected memory cell is "1". Here, the memory cell threshold voltage Vgth is, for example, 0.5V.

As shown in FIG. 6, the value of a cell current IdsL of the defective memory cell when the gate voltage Vg is lower than the memory cell threshold voltage Vgth is equal to the value of the leakage current LK in both cases where the data value is "0" or "1". In addition, the value of a cell current Ids of the normal memory cell when the gate voltage Vg is lower than the memory cell threshold voltage Vgth is nearly 0V in both cases where the data value is "0" or "1".

Since the row decoder 5 provides a gate voltage Vg0 of 0V to the selected word line, the cell current Ids that flows from the normal memory cell to the bit line is nearly zero, which is less than the reference current Iref0, in both cases where the data value is "0" or "1". In addition, the cell current IdsL that flows from the defective memory cell to the bit line is greater than the reference current Iref0 in both cases where the data value is "0" or "1".

Accordingly, it is possible to determine whether each of the memory cells M11 to Mnm is normal or defective, regardless of whether the data value of each of the memory cells M11 to Mnm is "0" or "1". That is, when the initial data value of each of the memory cells M11 to Mnm is "1", it is possible to detect defective memory cells without writing a data value of "0" to each of the memory cells M11 to Mnm.

Since the cell current Ids of nearly 0V that is provided from a normal memory cell to the column switch 6 is smaller than the reference current Iref0, the sense amplifier 10 provides a signal indicating a logic value of "0" to the output buffer 11. On the other hand, since the cell current IdsL that is provided from a defective memory cell to the column switch 6 is greater than the reference current Iref0, the sense amplifier 10 provides a signal indicating a logic value of "1" to the output buffer 11.

Since the output buffer 11 outputs a data signal DT of "0" or "1" corresponding to the signal indicating the logic value "0" or "1" from the sense amplifier 10, it is possible to determine whether each of the memory cells M11 to Mnm is normal or defective, regardless of the data value of each of the memory cells M11 to Mnm.

In the embodiment described above, a gate voltage provided to the selected word line is at a level (preferably, 0V) smaller than the threshold of the memory cell, the level allowing both a cell current flowing when the data value of a normal memory cell is "0" and a cell current flowing when the data value of a normal memory cell is "1" to be nearly equal (to about 0 A) and also allowing both a cell current flowing when the data value of a defective memory cell is "0" and a cell current flowing when the data value of a defective memory cell is "1" to be nearly equal to each other (for example, nearly equal to a leakage current). Therefore, it is possible to determine whether each of the memory cells M11 to Mnm is normal or defective, regardless of whether the data value of each of the memory cells M11 to Mnm is "0" or "1", i.e., without being limited by the data value of the memory cell. That is, when the initial data value of each of the memory cells M11 to Mnm is "1", it is possible to detect defective memory cells without writing a data value of "0" to each of the memory cells M11 to Mnm. Accordingly, it is possible to easily detect defective memory cells.

Although the nonvolatile semiconductor memory is, for example, a memory such as a Production Programmed ROM (P2ROM) which is a mask ROM compatible memory, the present disclosure may also be applied to various other types of memories.

Following from the above description and embodiment, it should be apparent to those of ordinary skill in the art that, while the foregoing constitutes an exemplary embodiment of the present disclosure, the disclosure is not necessarily limited to this precise embodiment and that changes may be made to this embodiment without departing from the scope of the invention as defined by the claims. Additionally, it is to be understood that the invention is defined by the claims and it is not intended that any limitations or elements describing the exemplary embodiment set forth herein are to be incorporated into the interpretation of any claim element unless such limitation or element is explicitly stated. Likewise, it is to be understood that it is not necessary to meet any or all of the identified advantages or objects of the disclosure discussed herein in order to fall within the scope of any claims, since the invention is defined by the claims and since inherent and/or unforeseen advantages of the present disclosure may exist even though they may not have been explicitly discussed herein.

What is claimed is:

1. A nonvolatile semiconductor memory comprising:

a plurality of memory cells arranged in a matrix of rows and columns;

a plurality of word lines, each being commonly connected to respective gates of memory cells arranged in one of the rows;

a plurality of bit lines commonly connected to respective sources of memory cells arranged in one of the columns;

a drain voltage generator that provides a drain voltage to respective drains of the plurality of memory cell;

a row decoder that selects one of the plurality of word lines;

a column decoder that selects one of the plurality of bit lines;

a sense amplifier that outputs data based on comparison of a cell current from a memory cell corresponding to the selections by the row and column decoders with a reference current; and a mode selector that outputs either a normal mode signal or a test mode signal according to a mode selection instruction, wherein the row decoder provides a normal mode voltage to the selected word line according to the normal mode signal and provides a test mode voltage lower than the normal mode voltage to the selected word line according to the test mode signal.

2. The nonvolatile semiconductor memory according to claim 1, wherein the test mode voltage is lower than a threshold voltage of the memory cell.

3. The nonvolatile semiconductor memory according to claim 2, wherein the test mode voltage is a ground voltage.

4. A method For detecting leakage defects in a nonvolatile semiconductor memory including a plurality of memory cells arranged in a matrix of rows and columns, a plurality of word lines, each being commonly connected to respective gates of memory cells arranged in one of the rows, a plurality of bit lines commonly connected to respective sources of memory cells arranged in one of the columns, a drain voltage generator that provides a drain voltage to respective drains of the plurality of memory cell, a row decoder that selects one of the plurality of word lines, a column decoder that selects one of the plurality of bit lines, and a sense amplifier that outputs data based on comparison of a cell current from a memory cell corresponding to the selections by the row and column decoders with a reference current, the method comprising:

a mode selection process for outputting either a normal mode signal or a test mode signal according to a mode selection instruction; and a word line voltage providing process for providing a normal mode voltage to the selected word line according to the normal mode signal and providing a test mode voltage lower than the normal mode voltage to the selected word line according to the test mode signal.

5. The method according to claim 4, wherein the test mode voltage is lower than a threshold voltage of the memory cell.

6. The method according to claim 5, wherein the test mode voltage is a ground voltage.

7. The nonvolatile semiconductor memory according to claim 1, wherein the test mode voltage is smaller than a threshold voltage of a memory cell when a binary data value stored in the memory cell is "1".

8. The method according to claim 4, wherein the test mode voltage is smaller than a threshold voltage of a memory cell when a binary data value stored in the memory cell is "1".

* * * * *